United States Patent [19]

Nishida

[11] Patent Number: 5,311,204

[45] Date of Patent: May 10, 1994

[54] OFFSET ELECTRODES

[75] Inventor: Daryl L. Nishida, Aloha, Oreg.

[73] Assignee: Tektronix, Inc., Wilsonville, Oreg.

[21] Appl. No.: 936,957

[22] Filed: Aug. 27, 1992

[30] Foreign Application Priority Data

Aug. 28, 1991 [JP] Japan ............... 3-076300[U]

[51] Int. Cl.⁵ .......................................... G09G 3/28
[52] U.S. Cl. ...................................... 345/60; 345/87; 313/484
[58] Field of Search ............... 340/771, 773, 774, 784, 340/794, 795, 796, 797; 313/484, 491, 494, 584; 345/60, 87, 66, 67

[56] References Cited

U.S. PATENT DOCUMENTS

| | | | |
|---|---|---|---|
| 2,847,615 | 7/1958 | Engelbart | 315/84.6 |
| 3,812,486 | 5/1974 | Purchase | 340/173 |
| 4,352,101 | 9/1982 | De Jule | 340/769 |
| 4,450,441 | 5/1984 | Person et al. | 340/771 |
| 4,554,537 | 11/1985 | Dick | 340/773 |
| 4,595,919 | 6/1986 | Holz et al. | 340/793 |
| 4,896,149 | 1/1990 | Buzak | 340/794 |
| 5,077,553 | 12/1991 | Buzak | 340/794 |

OTHER PUBLICATIONS

Buzak, Thomas S., "Plasma Addressing for Flat-Panel Displays," *IEEE Circuits and Devices*, pp. 14-17, Sep. 1990.

Mikoshiba, Shigeo, "Plasma Displays", *Seminar 10, SID* 1987, pp. 10.2-10.37.

Dick, George W., "Plasma Display Panel Techniques," *Seminar 2, SID* 1985, pp. 2.2-1-2.2-54.

Primary Examiner—Richard Hjerpe
Attorney, Agent, or Firm—John D. Winkelman; Paul S. Angello

[57] ABSTRACT

Addressing apparatus that electronically address data sites of a digital array include electrodes (36, 38) manufactured with consistent electrical contact quality on the surfaces of projections (30) from a substrate (14). This is accomplished by providing such electrodes with portions that are offset to follow regions of more equal slope on the projections. The offset electrodes are of more consistent structural and electrical contact quality and thereby facilitate an increase in the yield of the manufacturing process.

9 Claims, 2 Drawing Sheets

OFFSET ELECTRODES

TECHNICAL FIELD

The present device relates generally to an addressing apparatus used to access data storage locations in a digital array memory or a flat panel display, particularly when the addressing apparatus incorporates an ionizable gas.

BACKGROUND OF THE INVENTION

Digitally encoded information is often stored or processed using an addressing scheme that electronically accesses individual data storage sites arranged in a solid-state digital array. Japanese Laid Open Patent Application No. 217396/89 and its counterpart U.S. Pat. Nos. 4,896,149 and 5,077,553, which are assigned to the assignee of the present application, disclose an addressing apparatus of this type in which row addressing is achieved by means of an ionizable gas. FIG. 3 depicts a prior art flat panel video display that incorporates such an apparatus.

The flat panel display apparatus 10 includes electrically non-conductive, optically transparent first and second substrates 12 and 14 positioned face-to-face to each other. Multiple conductors extending in parallel to one another in a first direction on the inner surface of the first substrate 12 form column electrodes 16 for receiving data drive signals from a data drive circuit (not shown). Multiple channels 18 are formed in the inner surface of the second substrate 14 so that they extend parallel to one another in a second direction transverse to the first direction. A reference potential row electrode 20 and a strobe row electrode 22 electrically isolated from each other extend along the length of the interior of each channel. The reference potential row electrodes 20 are commonly grounded on one side of the channels, and each of the strobe row electrodes 22 receives a data strobe signal from a data strobe circuit on the other side of the channels. Each of the channels 18 is filled with an ionizable gas, such as helium.

A layer 24 of electro-optic material, such as a liquid crystal material, and a layer 26 of a dielectric material are positioned between the first and second substrates 12 and 14. The layer 26 of dielectric material covering the channels 18 forms a barrier between the liquid crystal material layer 24 and the ionizable gas. The size of display elements 28 defined by the overlapping areas of the column electrodes 16 and the channels 18. The ionizable gas functions as an electrical switch that changes between a conducting or plasma state and a nonconducting or nonionized state in response to the voltage of the data strobe signal.

Whenever the gas is in a conducting state, the voltage of the data drive signal is developed across the liquid crystal material in a region spatially aligned with the region of ionized gas. When display apparatus 10 receives light propagating from an external source, the data drive signal on a column electrode 16 determines the luminance of a display image. Whenever the gas changes to the non-conducting state, the voltage of the data drive signal developed across the liquid crystal material is held for a predetermined time. Such addressing apparatus of the flat panel display 10 is referred to as a plasma addressing apparatus. The plasma addressing apparatus provides an improved yield for a flat panel display having a layer display element density because it does not rely on two- or three-terminal semiconductor devices.

FIG. 4 shows a part of the second substrate 14 in detail. The channel 18 is formed by a flat surface of the second substrate 14 and opposite side walls 32 of adjacent projections 30. When the data strobe signal having a predetermined voltage is applied to the strobe row electrode 22, the gas between the reference row electrode 20 and the strobe row electrode 22 changes to the conducting state. Then, the portion of liquid crystal material located in an area defined by the space between the row electrodes 20 and 22 and the width of the row electrode 16 acts as a display element. It is desirable that the space between the row electrodes 20 and 22 be close to the width of the channel 18 to provide narrow gap between the display elements. Thus, the row electrodes are deposited on the side wall 32 of the projection 30. The row electrodes 20 and 22 pass along the steep end wall 34 at both ends of the projection 30 and extend out of the channel 18 to receive the reference potential and the data strobe signal, respectively.

Proper operation of display apparatus 10 depends in part on the structural quality of the electrodes that energize the ionizable gas contained in the channels. The row electrodes 20 and 22 are formed using a conventional photolithographic technique. In the manufacturing process, a metal film of conductive material, such as nickel, is deposited over the inner surface of the second substrate 14 having the channels 18. Then, a photoresist layer is formed over the metal layer and exposed to incident light passing through a pattern having openings corresponding to the row electrodes 20 and 22 to be formed. By developing the photoresist, the photoresist material in the area where the row electrodes 20 and 22 are not formed is removed. The row electrodes 20 and 22 are formed by etching the exposed metal film.

There is, however, a problem stemming from the fact that the end wall 34 is much steeper than the remaining area. The thickness of the photoresist on the end wall 34 is, therefore, much thinner than that of the photoresist in the remaining area. When the developing process is stopped at the time the light-unexposed photoresist on the end wall 34 is removed, the light-unexposed photoresist in the remaining area is left because it is not developed sufficiently. The metal film under the left light-unexposed photoresist is not exposed to the etching agent so that it is left as an undesirable metal film after etching. Thus, there is a possibility that the undesirable metal film short-circuits between the row electrodes 20 and 22. On the other hand, when the developing process is stopped at the time the light-unexposed photoresist in the remaining area is removed, the photoresist on the end wall 34 is developed to excess so that the exposed photoresist is partly removed. Thus, there is a possibility that the row electrodes 20 and 22 have open portions. The short-circuit and the open portions of the row electrodes 20 and 22 prevent the gas in the channel 18 from being placed in the conducting state.

An object of the present invention is, therefore, to provide electrode contacts of more consistent structural quality such that addressing apparatus incorporating these electrodes may manufactured at higher yield.

SUMMARY OF THE INVENTION

An addressing apparatus according to the present invention includes non-conductive and optically transparent first and second substrates positioned face-toface to each other. Multiple non-overlapping conductors extending in a first direction along the inner surface of the first substrate form column electrodes for receiving data drive signals. Multiple non-overlapping channels formed into the inner surface of the second substrate extend along the inner surface in a second direction generally transverse to the first direction. Each overlapping portion of the column electrode and the channel forms a data element. Linear portions of reference row electrodes and strobe row electrodes are formed on different side walls of adjacent longitudinal projections in the second substrate that define channels in the substrate surface. The row electrodes are redirected at points adjacent to the end walls of these projections and extend down to a flat surface of the second substrate along the projection side walls. The slope of these side walls is much gentler than that of the end walls. The row electrodes are then redirected and extend out of the channel. Thus, the row electrodes bypass the steep end walls and thereby solve the problem of short- and open-circuits in the row electrodes.

DETAILED DESCRIPTION OF PREFERRED EMBODIMENTS

Figure 1:
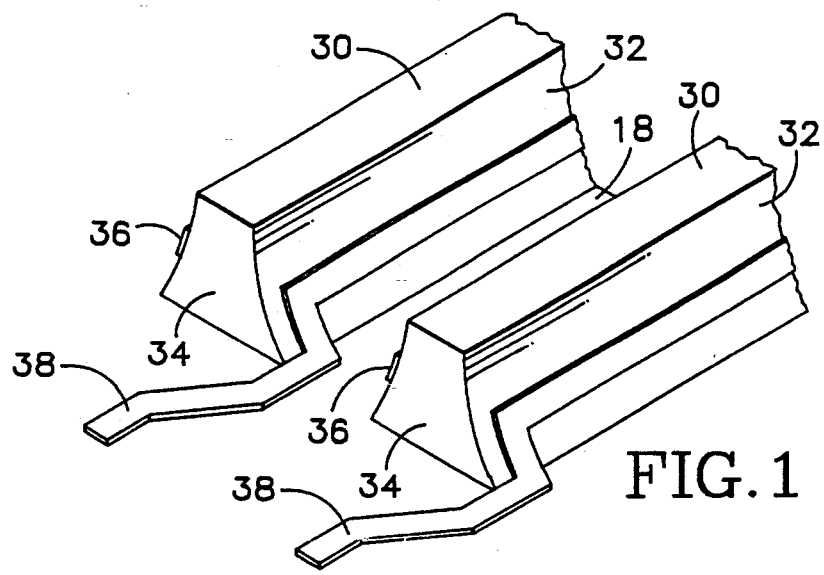
FIG. 1 is a fragmentary isometric view of an electrode portion of an addressing apparatus according to the present invention.
Figure 4:
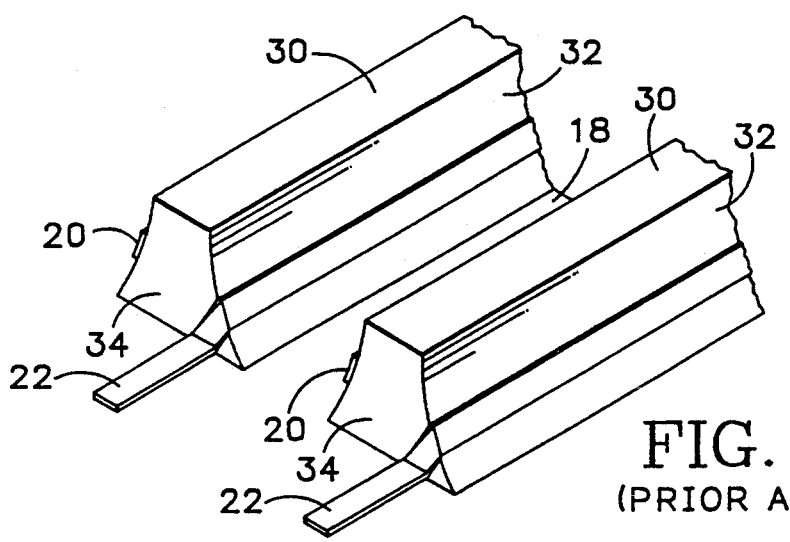
FIG. 4 is a fragmentary isometric view of an electrode portion of an addressing apparatus in accordance with the prior art.
Figure 3:
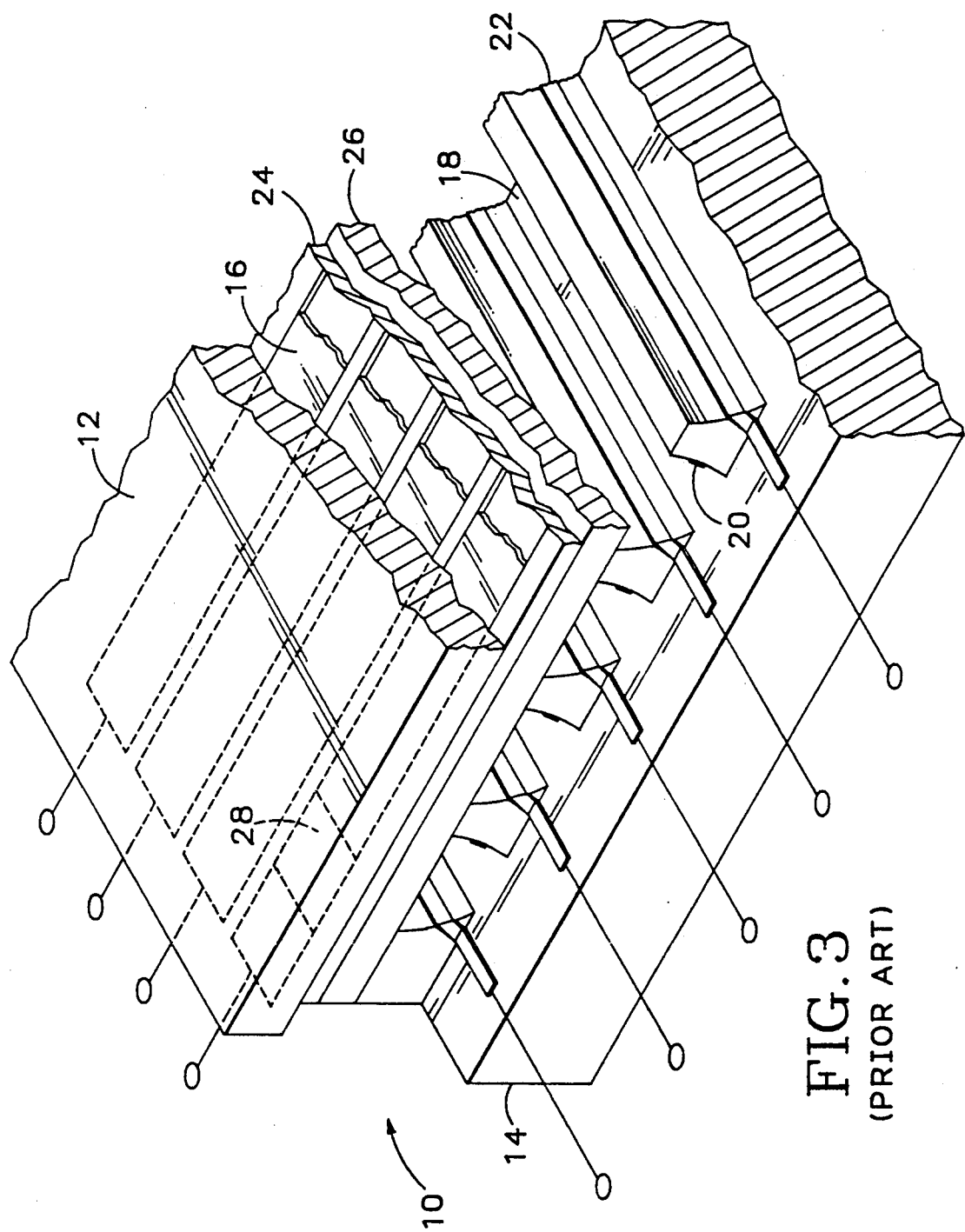
FIG. 3 is a fragmentary isometric view showing the layers of structural components of a flat panel display using an addressing apparatus according to the prior art.

FIG. 1 depicts an addressing apparatus according to the present invention. Since the elements of the present invention, except for reference row electrodes 36 and strobe row electrodes 38, are same as those of the conventional addressing apparatus shown in FIGS. 3 and 4, these common elements are described with the same names and reference numerals.

Reference row electrodes 36 and strobe row electrodes 38 are deposited by using the conventional photolithographic technique. Linear portions of row electrodes 36 and 38 are respectively formed on the side walls 32 of the neighboring projections 30 defining a channel 18 in the longitudinal direction of the projections 30. The row electrodes 36 and 38 are redirected at points adjacent to the steep end walls 34, allowing the electrodes to bypass them. Instead, the electrodes pass along the more gently sloping sidewall 32. At the base of projection 30, the electrodes extend down to a flat surface of second substrate 14, at which point they are redirected and extend out of channel 18.

Figure 2:
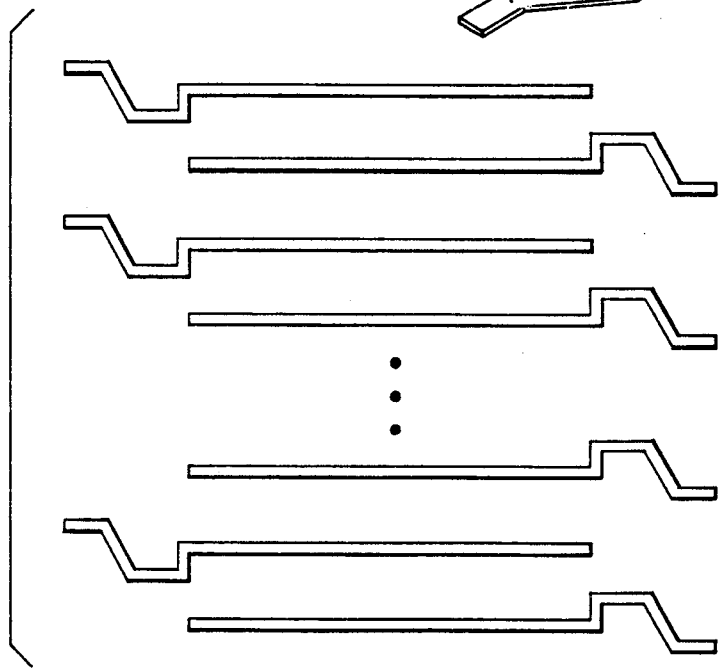
FIG. 2 is a plan view of row electrodes of the addressing apparatus according to the present invention.

FIG. 2 is a top level plan view of the pattern formed by the offset electrodes, with the reference row electrodes on one side (either left or right may be presumed) and the strobe row electrodes on the opposite side. The points at which the electrodes on a particular side change directions are placed in the same relative locations such that the electrodes remain substantially parallel to one another. An alternative embodiment of present invention would use a pattern in which the electrode ends are not redirected at sharp angles, but rather are curved in an S-shaped pattern in order to avoid the end wall 34. Any pattern of curves or bends in the electrode directions that allows them to remain substantially parallel, but which avoids the end wall 34 is in accordance with the present invention.

Having illustrated and described the principles of the invention with reference to several preferred embodiments, it should be apparent to those skilled in the art that the invention may be modified without departing from such principles.

I claim:

1. Apparatus for digitally addressing an electronic array, comprising:

a first substrate that has plural first electrodes formed on a first major surface, the first electrodes formed substantially parallel to one another;

a second substrate that has plural channels formed on a second major surface facing the first major surface of said first substrate, the channels formed by projections extending substantially parallel to one another and in a direction transverse to the first electrodes, each projection having a sidewall and an end wall, with each channel having a pair of second electrodes each formed longitudinally on the sidewalls and extending along and out of the channels, and with the channels containing between the second electrodes a material whose electronic properties change in response to applied electrical signals, the second electrodes routed on the sidewalls and, adjacent the end walls, routed from the sidewalls with a change of direction and from inside the channels to outside the channels so as to avoid large discontinuities in slope and so as to avoid contact with the end walls.

2. The apparatus of claim 1 in which the second electrodes are routed in angular turns within the plane of the sidewalls in a manner that avoids the end walls.

3. The apparatus of claim 1 in which the second electrodes are routed in a curved fashion within the plane of the sidewalls in a manner that avoids the end walls.

4. The apparatus of claim 1 in which the material contained within the channels comprises an ionizable gas.

5. The apparatus of claim 1 in which a layer of dielectric material is positioned between said first and second substrates.

6. The apparatus of claim 5 in which a layer of electro-optical material is positioned between said first substrate and said layer of dielectric material.

7. The apparatus of claim 1 in which the second electrodes are routed in angular turns on the sidewalls.

8. The apparatus of claim 1 in which the second electrodes are routed in a curved fashion on the sidewalls.

9. In a substrate which has plural channels formed on a major surface, the channels being formed by projections extending substantially parallel to each other, each projection having a sidewall and an end wall, with each channel having an electrode formed longitudinally on each sidewall, with each electrode extending along and out of the channels, and with the channels containing between the electrodes a material whose electronic properties change in response to applied electrical signals, an improvement comprising:

the electrodes are routed on the sidewalls and, adjacent the end walls, from the sidewalls with a change of direction and from inside the channels to outside the channels so as to avoid large discontinuities in slope and so as to avoid contact with the end walls.

* * * * *